United States Patent
Misic

(10) Patent No.: US 7,012,430 B2
(45) Date of Patent: *Mar. 14, 2006

(54) TRANSMIT/RECEIVE PHASED ARRAY COIL SYSTEM

(75) Inventor: George J. Misic, Allison Park, PA (US)

(73) Assignee: Medrad, Inc., Indianola, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/714,509

(22) Filed: Nov. 14, 2003

(65) Prior Publication Data

US 2004/0155657 A1 Aug. 12, 2004

Related U.S. Application Data

(60) Continuation of application No. 10/151,491, filed on May 20, 2002, now Pat. No. 6,714,013, which is a continuation of application No. 09/776,132, filed on Feb. 2, 2001, now Pat. No. 6,396,273, which is a continuation of application No. 09/512,093, filed on Feb. 24, 2000, now abandoned, which is a division of application No. 08/979,842, filed on Nov. 26, 1997, now Pat. No. 6,040,697.

(51) Int. Cl.
G01V 3/00 (2006.01)

(52) U.S. Cl. ...................................... 324/318; 600/421
(58) Field of Classification Search ................ 324/318, 324/322, 300, 306, 307, 309, 312, 314; 600/421, 600/422
See application file for complete search history.

(56) References Cited

U.S. PATENT DOCUMENTS 4,411,270 A 10/1983 Damadian
4,467,282 A 8/1984 Siebold (Continued)

FOREIGN PATENT DOCUMENTS

| EP | 0 758 091 | 2/1997 |
|---|---|---|
| WO | WO 98/37438 | 8/1998 |

OTHER PUBLICATIONS

Medrad Inc. v. MRI Devices Corporation (Fed. Cir.) 04–1134 (Mar. 16, 2005).

Petition for Rehearing of Plaintiff–Appellant Medrad, Inc., Civil Action No. 02–2044 (Mar. 30, 2005).

(Continued)

*Primary Examiner*—Louis Arana
(74) *Attorney, Agent, or Firm*—James R. Stevenson; Gregory L. Bradley

(57) ABSTRACT

A phased array coil system is presented for use with a magnetic resonance system. The phased array coil system includes a first coil, a second coil, and an interface subsystem. The first coil defines a first region and the second coil defines a second region, with the first coil partially overlapping the second coil to define an overlap region formed by the intersection of the first and second region. Operably connected with the first and second coils, the interface subsystem includes (i) a power splitter for splitting radio frequency (RF) power for delivery to the first and second coils and (ii) a phase compensator for adjusting the phase relationship of the RF power delivered to the first and second coils so that a magnetic field produced thereby in the overlap region is approximately equal to that produced near the center of each of the first and second regions.

60 Claims, 6 Drawing Sheets

U.S. PATENT DOCUMENTS

| | | | |
|---|---|---|---|
| 4,680,548 A | 7/1987 | Edelstein et al. |
| 4,692,705 A | 9/1987 | Hayes |
| 4,707,664 A | 11/1987 | Fehn et al. |
| 4,793,356 A | 12/1988 | Misic et al. |
| 4,825,162 A | 4/1989 | Roemer et al. |
| 4,923,459 A | 5/1990 | Nambu |
| 5,179,332 A | 1/1993 | Kang |
| 5,258,717 A | 11/1993 | Misic et al. |
| 5,374,890 A | 12/1994 | Zou et al. |
| 5,394,087 A | 2/1995 | Molyneaux |
| 5,483,158 A | 1/1996 | van Heteren et al. |
| 5,543,711 A | 8/1996 | Srinivasan et al. |
| 5,551,430 A | 9/1996 | Blakeley et al. |
| 5,559,434 A | 9/1996 | Takahashi et al. |
| 5,565,779 A | 10/1996 | Arakawa et al. |
| 5,578,925 A | 11/1996 | Molyneaux et al. |
| 5,602,479 A | 2/1997 | Srinivasan et al. |
| 5,610,521 A | 3/1997 | Zou et al. |
| 5,621,323 A | 4/1997 | Larsen |
| 5,646,531 A | 7/1997 | Renz |
| 5,664,568 A | 9/1997 | Srinivasan et al. |
| 5,696,449 A | 12/1997 | Boskamp |
| 5,998,999 A | 12/1999 | Richard et al. |
| 6,040,697 A | 3/2000 | Misic |
| 6,137,291 A | 10/2000 | Szumowski et al. |
| 6,150,816 A | 11/2000 | Srinivasan |
| 6,177,797 B1 | 1/2001 | Srinivasan |

OTHER PUBLICATIONS

United States Court of Appeals for the Federal Circuit Disposition Sheet (Apr. 11, 2005).
MRI Devices' Response to Medrad's Motion to Vacate This Court's Entry of Summary Judgement (Sep. 24, 2003).
Declaration of Dr. Arne Reykowski (Sep. 24, 2003).
Declaration of Dr. Gregor Adriany (Sep. 19, 2003).
Medrad's Brief in Support of Its Motion for a Preliminary Injunction (Apr. 9, 2003).
MRI Devices' Opposition to Medrad's Motion for Preliminary Injunction (Apr. 14, 2003).
Medrad's Objections to the Magistrate Judge's Report and Recommendation (Jun. 19, 2003).
MRI Devices' Memorandum Supporting Magistrate Judge Mitchell's Report and Recommendation (Jul. 11, 2003).
Medrad's Reply to MRI Devices' Memorandum Supporting Magistrate Judge Mitchell's Report and Recommendation (Jul. 11, 2003).
Brief in Support of Medrad's to Alter Judgment and Alternative Motion for Relief from Judgment in View of New-Evidence That Goes to The Heart of the Case (Aug. 27, 2003).
Report and Recommendation (Oct. 7, 2003).
Medrad's Objections to the Magistrate Judge's Report and Recommendation (Oct. 21, 2003).
MRI Devices' Motion for Attorneys Fees and Expenses under 35 U.S.C. § 285 (Oct. 22, 2003).
MRI Devices' Memorandum Supporting Its Motion for Attorneys Fees and Expenses under 35 U.S.C. § 285 (Oct. 22, 2003).
MRI Devices' Response to the Magistrate Judge's Report and Recommendation (Oct. 29, 2003).
Memorandum Order (Nov. 18, 2003).
Judgment Order (Dec. 1, 2003).
Roemer, P. B., et al., "The NMR Phased Array," Magnetic Resonance in Medicine, vol. 16, Copyright 1990, Academic Press, Inc., pp. 192-225.

Jin, J., et al., "An Innovative Design of Combined Transmit/Receive RF Colls for MR Imaging," Department of Electrical and Computer Engineering, University of Illinois at Urbana-Champaign, Urbana, IL, Phillips Medical Systems North America, Shelton, CT, p. 1116, XP-002092172 (Aug. 1994).
Requardt, H., et al., "Switched Array Coils," Magnetic Resonance in Medicine, vol. 13, Mar. 1990, No. 3., pp. 385-397, XP000132470.
Duensing, R., et al., "A Continuously Variable Field of View Surface Coil," Magnetic Resonance in Medicine, vol. 13, No. 3, Mar. 1990, pp. 378-384, XP000132469.
"Knee Foot and Ankle Array," produced and sold by MRI Devices Corporation of Waukesha, WI under Model No. KFA, Product Data, CE0413 (Jul. 2000).
International Search Report for Counterpart PCT Application No. PCT/US98/23454.
Memorandum Order, Medrad, Inc. vs. MRI Devices Corporation, Civil Action No. 02-2044, Aug. 13, 2003.
Transcript of Testimony of Dr. Arne Reykowski at the Hearing ("Reykowski Transcript").
Deposition of Dr. Gregor Adriany ("Adriany Deposition").
Expert Report of Dr. Peter B. Roemer Concerning Noninfringement of Claims 1,2,3,5,16 and 23 of U.S.Patent No. 6,396,273 ("Roemer Noninfringement Report").
Expert Report of Kimberly A. Moore ("Moore Report").
MRI Devices' Motion for Summary Judgment of Noninfringement of the '273 Patent ("MRIDC's SJ Motion of Noninfringement").
MRI Devices' Memorandum Supporting Its Motion for Summary Judgment of Noninfringement of the '273 Patent ("MRIDC's Memo Supporting SJ Motion of Noninfringement").
MRI Devices' Motion for Summary Judgment to Invalidate Claims 1,2,3,5,16 and 23 of U.S. Patent No. 6,396,273 ("MRIDC's SJ Motion to Invalidate").
MRI Devices' Memorandum Supporting Its Motion for Summary Judgment to Invalidate Claims 1,2,3,5,16 and 23 of U. S. Patent No. 6,396,273 (MRIDC's Memo Supporting Invalidity Motion).
Appendix In Support of MRI Devices' Motion for Summary Judgment to Invalidate Claims 1,2,3,5,16 and 23 of U.S. Patent No. 6,396,273 ("MRIDC's Appendix to Invalidity Motion").
Medrad's Opposition To MRI Devices' Motion For Partial Summary Judgment To Invalidate Certain Claims Of U.S. Patent No. 6,396,273 ("Medrad's Opposition to MRIDC's SJ Motion to Invalidate").
MRI Devices' Reply Supporting Its Motion For Summary Judgment to Invalidate All Asserted Claims of U. S. Patent No. 6,396,273 (MRIDC's Reply).
Appendix in Support of MRI Devices' Reply Supporting its Motion for Summary Judgment to Invalidate All Asserted Claims of U. S. Patent No. 6,396,273, ("MRIDC's Appendix to Reply").
Report and Recommendation of Magistrate Judge to Federal District Judge Terrence F. McVerry ("Magistrate's Report and Recommendation").
Plaintiff Medrad's Supplemental Responses to Defendant's First Set of Interrogatories (Mar. 26, 2003).
Expert Report of Dr. Cecil E. Hayes Pursuant to Rule 26(a)(2)(B) of the Federal Rules of Civil Procedures (Mar. 31, 2003).

Expert Report of Kenneth W. Belt Pursuant to Rule 26(a)(2)(B) of the Federal Rules of Civil Procedure (Mar. 31, 2003).
Adriany, G., et al., "A Transmit/Receive Quadrature Birdcage Array Coil for 4 Tesla," Proceedings of the International Society for Magnetic Resonance in Medicine, Fifth Scientific Meeting and Exhibition, vol. 1, p. 177 (Apr. 12–18, 1997).
Adriany, G., et al., "A Transmit/Receive Quadrature Birdcage Array for 4 Tesla," Presentation to the International Society for Magnetic Resonance in Medicine, Fifth Scientific Meeeting and Exhibition, Vancouver, B.C., Canada (Apr. 12–18, 1997).
Fitzsimmons, Jeffrey R., et al. "Radio Frequency Coil Development for High Field Whole Body MRI/MRS," High Field Workshop (Mar. 7, 1997).
Fitzsimmons, Jeffrey R., et al. "Very High Frequency Transceiver Phased Array RF Coil Development for Neuroimaging of the Human Cortex and Spinal Cord at 3 Tesla," NIH Grant Application (Feb. 1, 1997).
Reykowski, A., et al., "Novel Two Channel Volume Array Deign for Angiography of the Head and Neck," Proceedings of the Society of Magnetic Resonance, Second Meeting, vol. 1, p. 216 (Aug. 6–12, 1994).
Reykowski, A., Theory and Design of Synthesis Array Coils for Magnetic Resonance Imaging, (see pp. 162–191), Dissertation submitted to the Office of Graduate Studies of Texas A&M University (Dec. 1996).
Szumowski, J., et al., "A Telescopic Phased Array Coil for MRA of the Lower Extremities," Proceedings of the Society of Magnetic Resonance, vol. 2 (Aug. 19–25, 1995).
Merkle, H., et al., "A Dual–Quadrature, Transmit/Receive Surface Coil Design for Brain Studies at High Fields," International Society of Magnetic Resonance in Medicine, p. 962 (1995).
Monroe, J.W., et al., "Phased Array Coils for Upper Extremity MRA," MRM 33: 224–229 (1995).
Reykowski, A., "A Transmit–Receive Array for Angiography of the Head and Neck," Unpublished Paper (1995).
Lian J., et al., "Detachable RF Coil for Clinical Breast Imaging," Proceedings of the Society of Magnetic Resonance, vol. 1 (Aug. 19–25, 1995).
Complaint, Civil Action No. 02–2044, Medrad, Inc., (Plaintiff) v. MRI Devices Corporation (Defendant), Patent Infringement of Medrad's Patent USPN 6,396,273 (Nov. 25, 2002).
Answer, Civil Action No. 02–2044 (Dec. 16, 2002).
MRI Devices Corporation's Response to Medrad's First Set of Interrogatories, Civil Action No. 02–2044 (Jan. 20, 2002).
Plaintiff Medrad's Responses to Defendant's First Set of Interrogatories, Civil Action No. 02–2044 (Jan. 20, 2003).
Medrad's Responses and Objections to Defendant's Second Set of Interrogatories, Civil Action 02–2044 (Jan. 29, 2003).
Medrad's Responses and Objections to Defendant's Third Set of Interrogatories, Civil Action 02–2044 (Jan. 30, 2003).
Plaintiff Medrad's Responses to Defendant's Fifth Set of Interrogatories, Civil Action No. 02–2044 (Feb. 21, 2003).
MRI Devices Corporation's Supplemental Response to Medrad's Interrogatory No. 11, Civil Action No. 02–2044 (Feb. 21, 2003).
Medrad's Supplemental Responses and Objections to Defendants' First Set of Requests for Admissions, Civil Action No. 02–2044 (Feb. 24, 2003).
Medrad's Objections/Responses to Defendant's Fourth Set of Interrogatories, Civil Action No. 02–2044 (Mar. 4, 2003).
Duensing, G.R., et al., "Transceive Phased Array Designed for Imaging at 3T," Presentation at the High Field Imaging Workshop (Mar. 7, 1997).
MRI Devices Corporation's Second Supplemental Response to Medrad's Interrogatory No. II, Civil Action 02–2044 (Mar. 10, 2003).
Expert Report of Dr. Peter B. Roemer Concerning Invalidity of Claims 1,2,3,5,16 and 23 of U.S. Patent 6,396,273, Civil Action 02–2044 (Mar. 14, 2003).
"Optimized Birdcage Resonators for Simultaneous MRI of Head and Neck," Proceedings of the Society of Magnetic Resonance, p. 1349 (1993).
"Surface Coil Proton MR Imaging at 2T," Radiology, 161, No. 1, pp. 251–255, (Oct. 1986).
"Spatial Localization in 31P and 13C NMR Spectroscopy in vivo Using Surface Coils," Journal of Magnetic Resonance in Medicine, 1: 410–413 (1984).
"Comparison of Linear and Circular Polarization for Magnetic Resonance Imaging," Journal of Magnetic Resonance 64, 255–270 (1985).
"Brief of Plaintiff–Appellant Medrad Inc.," U.S. Court of Appeals for the Federal Circuit Case No. 04–1134.
"Brief of Defendant–Appellee MRI Devices Corporation," U.S. Court of Appeals for the Federal Circuit Case No. 04–1134.
"Reply Brief of Plaintiff–Appellant Medrad, Inc.," U.S. Court of Appeals for the Federal Circuit Case No. 04–1134.

TRANSMIT/RECEIVE PHASED ARRAY COIL SYSTEM

CROSS-REFERENCE TO RELATED APPLICATIONS

This application for patent is a continuation of U.S. application Ser. No. 10/151,491, filed May 20, 2002 now U.S. Pat. No. 6,714,013, which is a continuation of U.S. application Ser. No. 09/776,132, filed Feb. 2, 2001, now U.S. Pat. No. 6,396,273, which is a continuation of U.S. application Ser. No. 09/512,093, filed Feb. 24, 2000, now abandoned, which is a divisional of U.S. application Ser. No. 08/979,842, filed Nov. 26, 1997, now U.S. Pat. No. 6,040,697, the contents of which are incorporated herein by reference.

BACKGROUND OF THE INVENTION

The present invention relates to the field of magnetic resonance imaging (MRI) systems and, more particularly, to coils for use in such systems.

It is well known in the field of MRI systems to provide radio frequency signals in the form of circularly polarized or rotating magnetic fields having an axis of rotation aligned with a main magnetic field. It is also well known to use receiving coils to intercept a radio frequency magnetic field generated by a human subject or an object in the presence of the main magnetic field in order to provide an image of the human subject or the object.

Receiving coils of this type were formed as volume coils in order to enclose a volume for receiving a body part such as a leg, arm or hand and intercept the radio magnetic field. See, for example, U.S. Pat. No. 4,411,270 issued to Damadian and U.S. Pat. No. 4,923,459 issued to Nambu. Additionally, surface receiving coils were developed for this purpose. The surface receiving coils were placed adjacent a region of interest. For a surface receiving coil, see U.S. Pat. No. 4,793,356 to Misic et al., for example.

Advances in the field of MRI systems have resulted in modifications to both volume receiving coils and surface receiving coils in order to improve their signal to noise ratios. This was achieved by modifying the receiving coils to receive perpendicular components of the radio frequency magnetic field. These improved coils are known as quadrature coils. Quadrature coils provided a significant signal to noise ratio improvement over non-quadrature coils. See, for example, U.S. Pat. No. 4,467,282 issued to Siebold and U.S. Pat. No. 4,707,664 issued to Fehn.

In U.S. Pat. No. 5,258,717, issued to Misic, a quadrature receiving coil system was provided, along with a data acquisition system. The data acquisition system taught by Misic included multiple image processing channels for processing a plurality of MRI signals and combining the processed signals to produce an image. The receiving coil system of Misic was formed of multiple quadrature receiving coils, the receiving coils being adapted to intercept both of the quadrature components of the magnetic resonance signals in a spatially dependent manner. Such quadrature coil systems provided coverage of a portion of a total target sensitive volume along an axis parallel to the main magnetic field. Consequently, each receiving coil of the system had a sensitive volume smaller than that which would otherwise be necessary. Thus, each receiving coil provided an improved signal to noise ratio for the region within its sensitive volume. Two leads were connected to each receiving coil and each lead was connected to a separate processing channel of the data acquisition system. The outputs of the processing channels were combined and a final data set from the entire target sensitive volume was calculated. The calculated data set had a better signal to noise ratio greater than that which could be achieved with a single receiving coil.

However, the various receiving coils of the prior art described had a number of artifact problems. For example, an image provided using the prior art receiving coils could have artifacts due to aliasing caused when the phase of a signal from a part of the anatomy within the field of the coil duplicates that of a location elsewhere. This occurs because a phase location of 370 degrees appears to the system as a phase location of 10 degrees. Thus, a signal from anatomy at a phase location of −350 or 370 degrees manifests itself in the image at a phase location of 10 degrees within the field of view. Elimination of phase wrap essentially halves the actual phase field of view, shifting from −90 to +90 degrees rather than from −180 to +180 degrees. However, this merely moves the alias location to more than +/−1.5 the field of view rather that eliminating it.

Another form of artifact, sometimes referred to as an annafact, can occur in either the frequency direction or the phase direction within prior art MRI systems. In this type of artifact, an area of anatomy that is at least partially within the excitation field of the body coil has a local Larmour frequency identical to a pixel within the imaging field of view. If there is any excitation and subsequent pickup of this material, it appears within the field of view superimposed upon the desired image, regardless of whether the artifact comes in from the frequency direction or the phase direction. The problems associated with this type of artifact are worsened by the use of higher speed gradients that are shorter in physical size and lower field uniformity.

It is therefore an objective of the invention to provide a coil system and/or method that eliminates soft tissue artifacts and aliasing artifacts typical of prior art systems and/or methods for imaging various regions of interest.

Another objective of the present invention is to provide improved signal to noise performance, for example, by permitting the use of smaller fields of view and thinner slices when performing imaging.

Another objective of the present invention is to provide greater image uniformity than provided in the prior art.

Another objective of the invention is to facilitate complete imaging of the regions of interest during a magnetic resonance imaging (MRI) procedure.

SUMMARY OF THE INVENTION

In a preferred embodiment, the invention provides a phased array coil system for use with a magnetic resonance imaging (MRI) system. The phased array coil system includes a first coil, a second coil, and an interface subsystem. The first coil defines a first region and the second coil defines a second region, with the first coil partially overlapping the second coil to define an overlap region formed by the intersection of the first and second regions. Overably connected with the first and second coils, the interface subsystem includes (i) a power splitter for splitting radio frequency (RF) power for delivery to the first and second coils and (ii) a phase compensator for adjusting the phase relationship of the RF power delivered to the first and second coils so that a magnetic field produced thereby in the overlap region is approximately equal to that produced near the center of each of the first and second regions.

In a related embodiment, the invention provides a phased array coil system for use with a magnetic resonance imaging (MRI) system. The phased array coil system includes a first coil, a second coil, and an interface subsystem. The first coil defines a first region and the second coil defines a second region, with the first coil partially overlapping the second coil to define an overlap region formed by the intersection of the first and second regions. Operably connected with the first and second coils, the interface subsystem includes (i) a power splitter for splitting radio frequency (RF) power for delivery to the first and second coils and (ii) a phase compensator for adjusting the phase relationship of the RF power delivered to the first and second coils to cause partial destructive/constructive interference thereof in the overlay region so that a magnetic field produced thereby in the overlay region is approximately equal to that produced near the center of each of the first and second regions.

In a further related embodiment, the invention provides a transmit/receive (T/R) phased array coil system for use with a magnetic resonance imaging (MRI) system. The T/R phased array coil system includes a first birdcage coil, a second birdcage coil, and an interface subsystem. The first birdcage coil encompasses a first region, the second birdcage coil encompasses a second region, with the first and second birdcage coils defining an overlap region in which one of the birdcage coils is partially overlapped by the other of the birdcage coils to form a phased array coil subsystem. Connected to the phased array coil subsystem, the interface subsystem includes a power splitter, an attenuator, a phase compensator, and a plurality of switches for enabling the interface subsystem to be switched between a transmit state and a receive state. In the transmit state, the power splitter allocates radio frequence (RF) power received from the MRI system between the first and second birdcage coils with the attenuator reducing the RF power directed to at least one of the first and second birdcage coils so that (A) a first magnetic field is applied through the first birdcage coil to the first region encompassed thereby and (B) a second magnetic field is applied through the second birdcage coil to the second region encompassed thereby with the phase compensator affecting a phase relationship between the first and second magnetic fields so that a resulting magnetic field produced thereby in the overlay region is approximately equal to the first and second magnetic fields produced near the center of the first and second regions, respectively. In the receive state, the interface subsystem receives from the phased array coil subsystem a response of an anatomical structure placed therein and conveys the response to the MRI system.

DETAILED DESCRIPTION OF THE INVENTION

Figure 1:
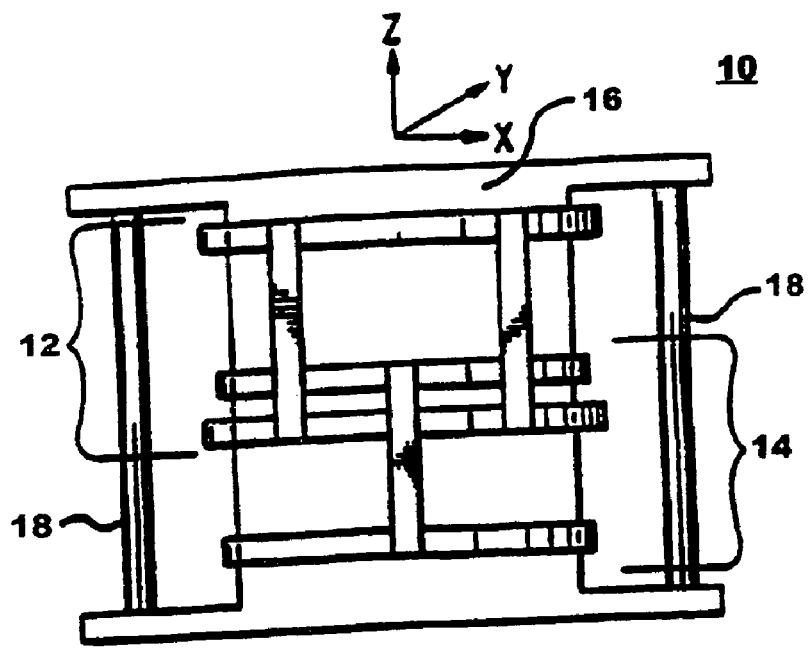
FIG. 1 is a side view of a prior art multiple quadrature receiving coil system wherein each coil of the quadrature coil system is a birdcage coil.
Figure 2:
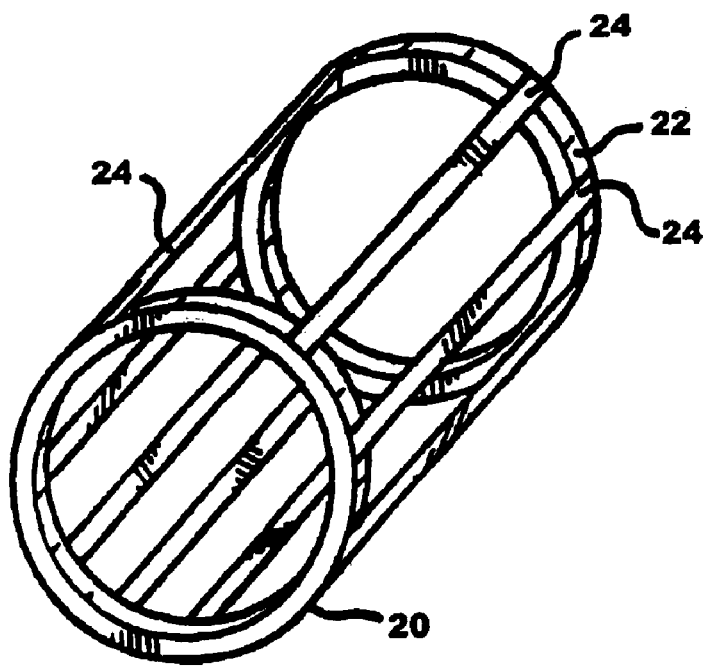
FIG. 2 is a perspective view of a single quadrature birdcage coil forming part of the prior art multiple quadrature receiving coil system of FIG. 1.

Referring now to FIGS. 1 and 2, there is shown a prior art multiple quadrature receiving coil system 10. This prior art multiple quadrature receiving coil system 10 was formed of quadrature receiving coils 12 and 14, which were designed for a variety of anatomical regions of the body, such as the knee, leg, arm or head. Quadrature receiving coils 12, 14 of quadrature receiving coil system 10 are thus volume coils. Coils 12, 14 are disposed around a hollow cylindrical drum support member 16. Support rods 18 extending the length of cylindrical drum 16 can be provided to stabilize the cylindrical drum support member 16.

Quadrature receiving coils 12, 14 are of a type referred to as birdcage coils, as well known in the art. They are formed of circular conductive loops 20, 22 connected to each other and spaced apart from each other by conductive connection members 24. There may be eight electrically conductive connection members 24 or rods 24 joining circular conductive loops 20, 22. Each receiving coil 12, 14 of coil system 10 formed in this manner can function as a separate quadrature receiving coil within coil system 10.

Magnetic interaction between quadrature receiving coils 12, 14 is eliminated by positioning quadrature coils 12, 14 about drum support member 16 to provide radial symmetry about the axis parallel to the main magnetic field, which is the Z-axis shown in FIG. 1. Moreover, quadrature coil 12 is slightly larger in diameter than quadrature coil 14 so that coil 12 can overlap a portion of coil 14. The amount of overlap of coils 12, 14 is adjusted so that the net flux from one coil, as seen as the vector sum of the flux from the overlap region, exactly cancels the flux from the return through the balance of the coil. In this case the field vector of the overlap region can be substantially equal to the field vectors of the other two regions. This causes the net shared flux of zero and thus a net mutual inductance of zero between quadrature receiving coils 12, 14. Coils 12, 14 maintain their isolation regardless of the relative rotational position about their common axis.

Quadrature coils 12, 14 of receiving coil system 10 have symmetry about two planes parallel to the Z-axis. The two planes of symmetry are at right angles to each other. In addition, quadrature coils 12, 14 are arranged so that the rotating magnetic vector of each receiving coil 12, 14 is in the X-Y plane. However, the net rotating magnetic vectors of coils 12, 14 are spatially displaced from each other along the Z-axis. In this regard, each receiving coil 12, 14 intercepts the quadrature components of the magnetic resonance signal within its own sensitive volume.

Figure 3:
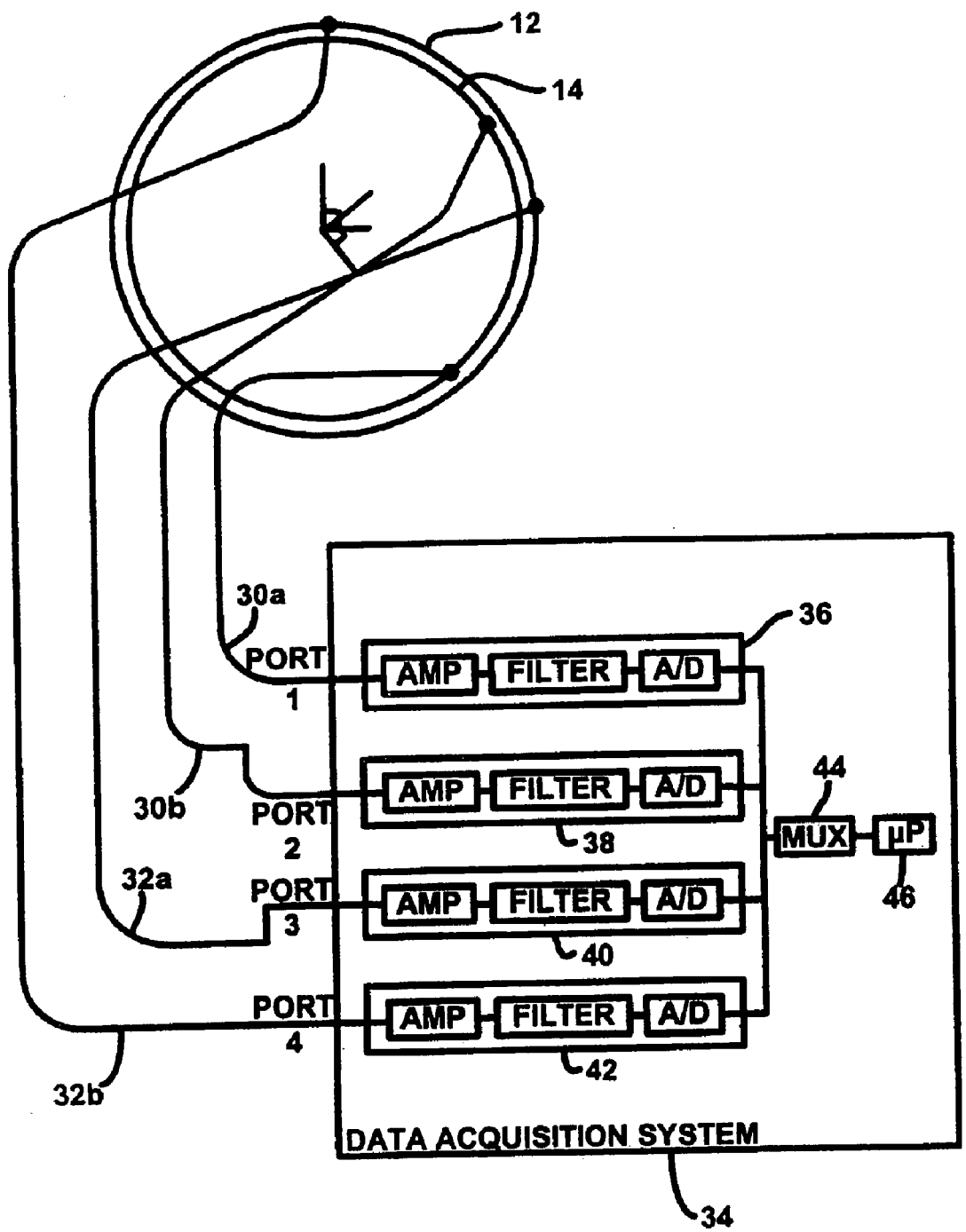
FIG. 3 is a schematic diagram illustrating possible electrical connections of the prior art multiple quadrature receiving coil system of FIG. 1.

Referring now to FIG. 3, there is shown a schematic representation of electrical connections that can be made to quadrature receiving coils 12, 14 of prior art quadrature receiving coil system 10. In this system, a plurality of electrical leads 30a, b are connected to quadrature coil 14 and a plurality of electrical leads 32a, b are connected to quadrature coil 12. The electrical leads 30a, b and 32a, b are preferably coaxial leads. Each coaxial lead 30a, b and 32a, b thus includes a center conductor and a shield, as is well known in the art. Each coaxial lead 30a, b and 32a, b coupled to quadrature coils 12, 14 is connected to a respective port 1-4 of data acquisition system 34. Data acquisition system 34 is described in an article by Roemer et al., entitled "The NMR Phased Array," Magnetic Resonance in Medicine, vol. 16 (1990), pp. 192–225. System 34 is provided with multiple data processing channels 36–42. Each data processing channel 36–42 includes an individual amplifier, filter, and A/D converter for processing the image signals received by a corresponding coaxial lead 30*a, b* or 32*a, b*. The outputs of data processing channels 36–42 are multiplexed by multiplexer 44 and combined by microprocessor 46 according to a weighting algorithm. The weighting algorithm is adapted to select the outputs of processing channels 36–42 and combine them to produce an overall image signal. For example, a combined image signal having a maximum signal to noise ratio can be provided by the weighting algorithm performed by microprocessor 46.

Coaxial leads 30*a, b* are connected to quadrature coil 14 at points that are at ninety degrees relative to each other and to ports 1, 2 of data acquisition system 34. Likewise, coaxial leads 32*a, b* are connected to quadrature coil 12 at points that are disposed at ninety degrees relative to each other. Coaxial leads 32*a, b* are also connected to ports 3, 4 of data acquisition system 34. An electrical network (not shown) can be interconnected between quadrature receiving coils 12, 14 and coaxial leads 30*a, b* and 32*a, b* to appropriately connect the cables to quadrature coils 12, 14. Such electrical networks are well known in the art. Furthermore, quadrature coils 12, 14 can be rotated (i.e., can accommodate different angular orientations) relative to one another without destroying the signal to noise improvements achieved in accordance with this prior art method. This is taught in U.S. Pat. No. 5,258,717 to Misic and incorporated by reference herein.

Figure 4:
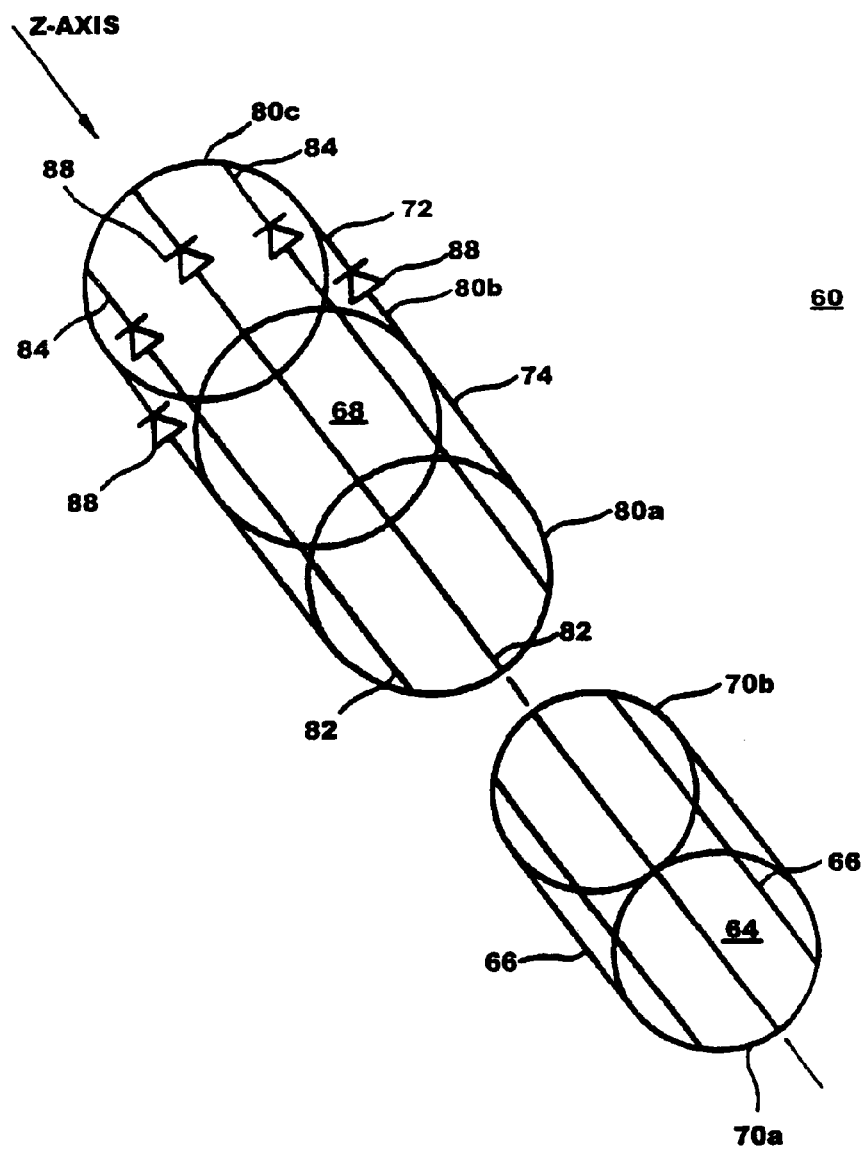
FIG. 4 is an exploded perspective view of a first preferred embodiment of the multiple quadrature receiver/transmitter coil system of the present invention.

Referring now to FIG. 4, there is shown an embodiment of the magnetic receiver/transmitter coil array system 60 of the present invention. Transmit/receive coil array system 60 can be formed of two quadrature birdcage coils: outer quadrature coil 68 and inner quadrature coil 64. Inner quadrature coil 64 can be disposed partially within the volume defined by outer quadrature coil 68. The quadrature coils 64, 68 can thus be provided with a critical overlap to reduce the mutual inductance therebetween and to therefore reduce the signal coupling between the coils 64, 68 to a negligible level, in a manner substantially as described for coil array system 10. In one possible preferred embodiment of coil array system 60, inner quadrature coil 64 can have a diameter of approximately 19.4 centimeters and outer quadrature coil 68 can have a diameter of approximately 22.5 centimeters. While coil array system 60 is shown in an exploded view for purposes of illustration, it will be understood that inner quadrature coil 64 is disposed within outer quadrature coil 68 during normal operation of coil array system 60.

In the preferred embodiment of coil array system 60 (as discussed in more detail below with respect to FIG. 6), inner coil 64 can be formed with eight electrically conductive rods 66 fixed to electrically conductive end rings 70*a,b*. Outer quadrature coil 68 can be formed of two sections: receive/transmit coil section 74 and auxiliary transmit coil section 72. Receive/transmit section 74 can be provided with eight electrically conductive rods 82 fixed to electrically conductive end rings 80*a,b* which act cooperatively to define an array volume. Auxiliary transmit coil section 72 can be provided with eight electrically conductive rods 84 connecting electrically conductive end rings 80*b,c*. Rods 66, 82 and 84 as well as end rings 70*a,b* and 80*a,b,c* can be any kind of electrical conductors such as, for example, conductive tubing, etched copper or copper tape or any other material suitable for inducing and detecting a magnetic field.

Furthermore, each conductive rod 84 of auxiliary transmit coil section 72 can be provided with a PIN diode 88. When PIN diodes 88 of auxiliary coil section 72 are forward biased, conductive rods 84 and ring 80*c* are electrically coupled to receive/transmit coil section 74. Thus, PIN diodes 88 can be used to couple and decouple portions of rods 84 and thereby substantially couple and decouple transmit coil section 72 and transmit/receive coil section 74. When conductive rods 84 or rod extensions 84 are switched in by PIN diodes 88 in this manner, the effective length of receive/transmit coil section 74 can be extended to thereby define a further array volume. PIN diodes 88 are forward biased and the length of coil section 74 is thereby extended in this manner when electrical energy is applied to outer coil 68 for the purpose of creating a magnetic field to form a magnetic resonance image. Although PIN diodes 88 can be used in the preferred embodiment for extending the length of outer coil 68, any kind of coupling and decoupling circuit known to those skilled in the art can be used.

It will be understood that coil array system 60 can be used for left or right imaging of the musculoskeletal system of human subjects. For example, coil array system 60 can be used for imaging a knee, a foot, an ankle, a wrist or a hand. The anatomical structures that can be imaged and evaluated using coil array system 60 can include ligaments, tendons, cartilage, osseous structures, fluid filled bursa, adipose tissue, muscle and potential pathological lesions. Furthermore, coil array system 60 is adapted to permit easy placement of the anatomy of interest within the array volume defined by coils 64, 68 and adapted to be disposed on a base to permit positioning left and right of isocenter.

Figure 5:
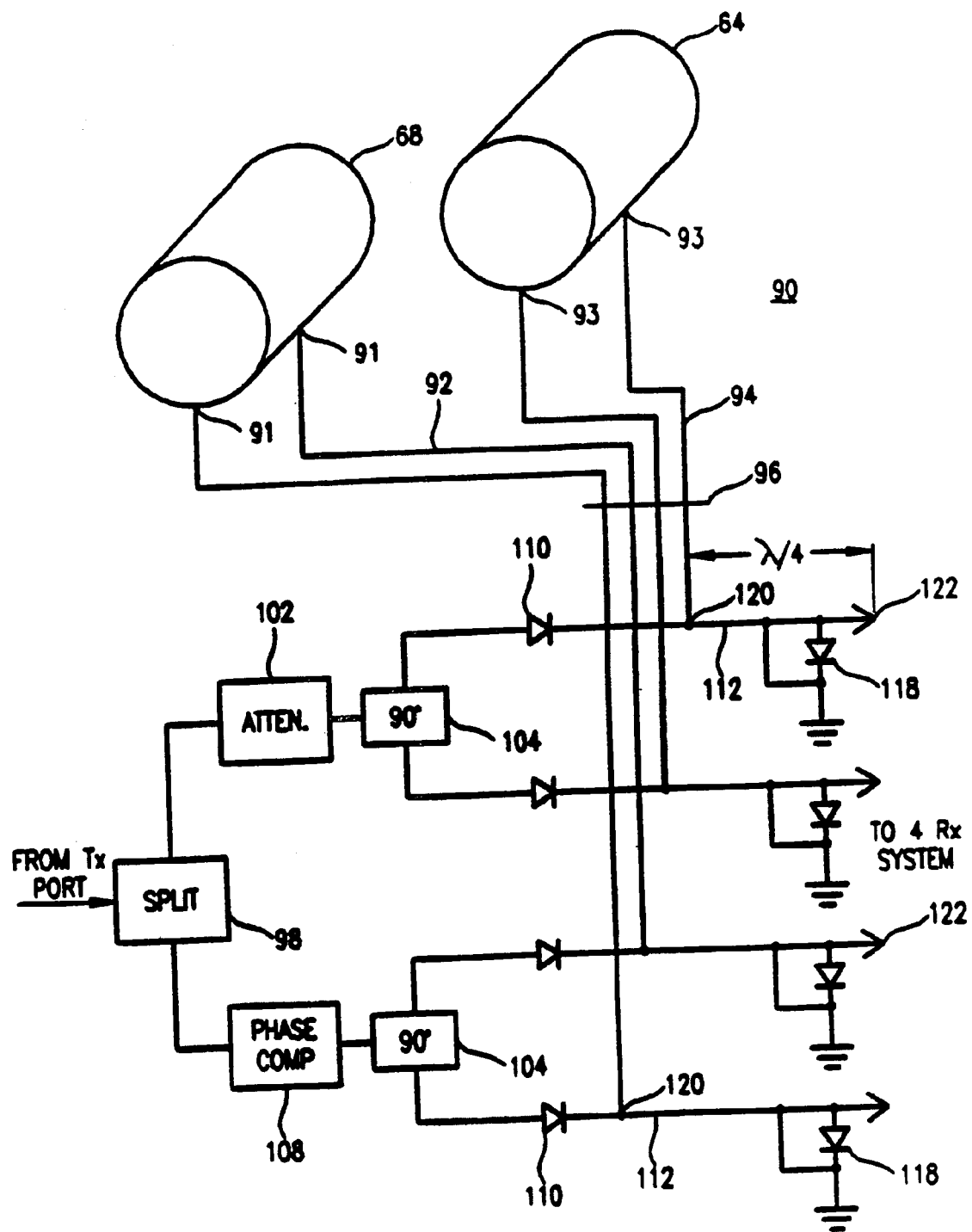
FIG. 5 is a schematic diagram of a second preferred embodiment of the present invention illustrating one possible way in which the transmit/receive phased array coil system of the invention can be electrically connected to a magnetic resonance imaging (MRI) system.

Referring now to FIG. 5, there is shown a second preferred embodiment of the present invention including a coil interface subsystem 90 coupled to coils 64, 68. The subsystem 90 applies energy to extended transmit/receive coils 64, 68 and receives the output of coils 64, 68 to form images of selected regions of interest. Within subsystem 90, electrical energy is received from a conventional transmitter port by splitter 98 for the purpose of applying a magnetic field to the region of interest by coil 64, coil 68 or both.

Energy from splitter 98 is applied to phase compensator 108 to obtain the correct phase relationship between the fields of coils 64, 68. The output of phase compensator 108 is applied to a ninety degree element 104. The outputs of the ninety degree element 104 are applied to isolated contact points 91, displaced ninety degrees from each other, by way of leads 92 and socket 96. Disposing contact points 91 at ninety degrees with respect to each other causes the orthogonal components of the rotating magnetic field signal to be completely received within coil system 64, 68.

Because the energy required by larger coil 68 may be more than the energy required by smaller coil 64, the energy supply path of smaller coil 64 is provided with attenuator 102 at the output of splitter 98. Additionally, a ninety degree element 104 is provided as previously described. The four outputs of the ninety degree elements 104 thus determine relative amplitudes and phases for driving the inputs of coil system 60 with the appropriate power levels and signal phases to provide the most uniform transmit field possible. For coil 64, energy from the outputs of the ninety degree element 104 is applied to coil 64 at contact points 93 by way of socket 96 and leads 94. Contact points 93 are disposed ninety degrees from each other as described with respect to contact points 91. In this manner, coil system 60 is provided with two quadrature pairs separated spatially along the Z-axis. Additionally, the voltage level and the phase applied to coils 64, 68 can be adjusted to provide a uniform field. Coils 64 and 68 can be crossed saddle quadrature coils or Helmholtz pairs.

It will be understood that alternative arrangements of attenuation and phase compensation can be used to obtain the required results. For example, both the attenuation and the phase compensation can be applied to one of the coils 64, 68 without any additional attenuation or phase compensation being applied to the other coil 64, 68. For example, the attenuation and phase compensation can be applied to the path of inner coil 64 only. Furthermore, if inner coil 64 serves as a receive only coil without serving as a transmit coil, then transmit power is applied only to outer coil 68. In this case, the transmit power can be applied to contact points 91 by way of a ninety degree element without necessarily using any additional attenuation or phase compensation. Further in this case, inner coil 64 does not require transmit decoupling.

Figure 6:
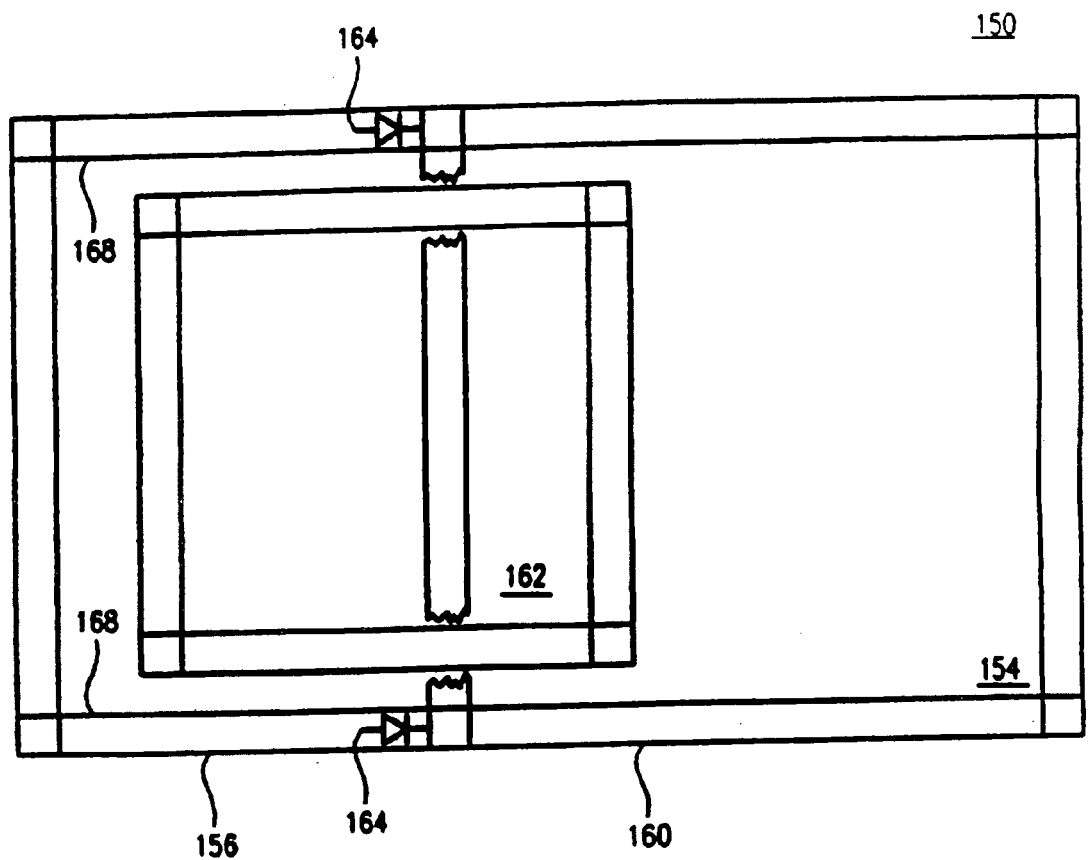
FIG. 6 is a side view of a preferred embodiment of the multiple quadrature receiver/transmitter coil system of the present invention similar to that shown in FIG. 4.

Referring now to FIG. 6, there is shown a side view of magnetic receiver/transmitter coil array system 150 of the present invention. Magnetic receiver/transmitter coil array system 150 is a preferred embodiment of the system of the present invention. Outer quadrature coil 154 and inner quadrature coil 162 are provided within magnetic receiver/transmitter coil array system 150 for performing substantially similar operations as those described with respect to coil array system 60.

For example, outer quadrature coil 154 is formed of coil sections 156, 160 wherein conductor rods 168 of coil section 156 are provided with PIN diodes 164. When PIN diodes 164 of coil section 156 are forward biased during transmission, the effective length of outer quadrature coil 154 is extended to be equal to the combined lengths of coil section 156 and coil section 160.

Each of the conductive rods 66, 82 and 84 of coil array system 60 can be provided with an adjustable tuning capacitor located at its mechanical center. The use of tuning capacitors in this manner is well known in the art and is not shown in order to simplify the drawings. The value of the tuning capacitors can be selected to allow each conductive rod 66, 82 and 84 to resonate at 63.87 MHz. A variable capacitor can be provided between the conductive rods containing the output contacts 91, 93. The additional variable capacitor can be used to optimize the isolation of the quadrature outputs.

A network for impedance matching the real part of the coil impedance to 50Ω through the two lattice baluns can be provided for each of the four conductive rods 66, 82 having contacts 91, 93. This can be accomplished using a series capacitive divider and an impedance transformation in the baluns. Additionally, each output port 122 can be followed by a balancing network including two series connected lattice baluns that are resonant at 63.87 MHz.

As shown in FIG. 5, output lines 112 apply signals from coils 64, 68 to output ports 122 that can be coupled to a conventional four receiver (i.e., data acquisition) system. The physical length of output lines 112 is approximately 37 inches from its junction 120 to the receiver, corresponding electrically to ¼ wavelength. In the preferred embodiment, each output port 122 has a PIN diode 118 coupled to an output line 112. PIN diodes 118 act as switches to connect coils 64, 68 to the receiver system during data acquisition and to disconnect the receiver system from the transmit port during the transmit stage.

Figure 7:
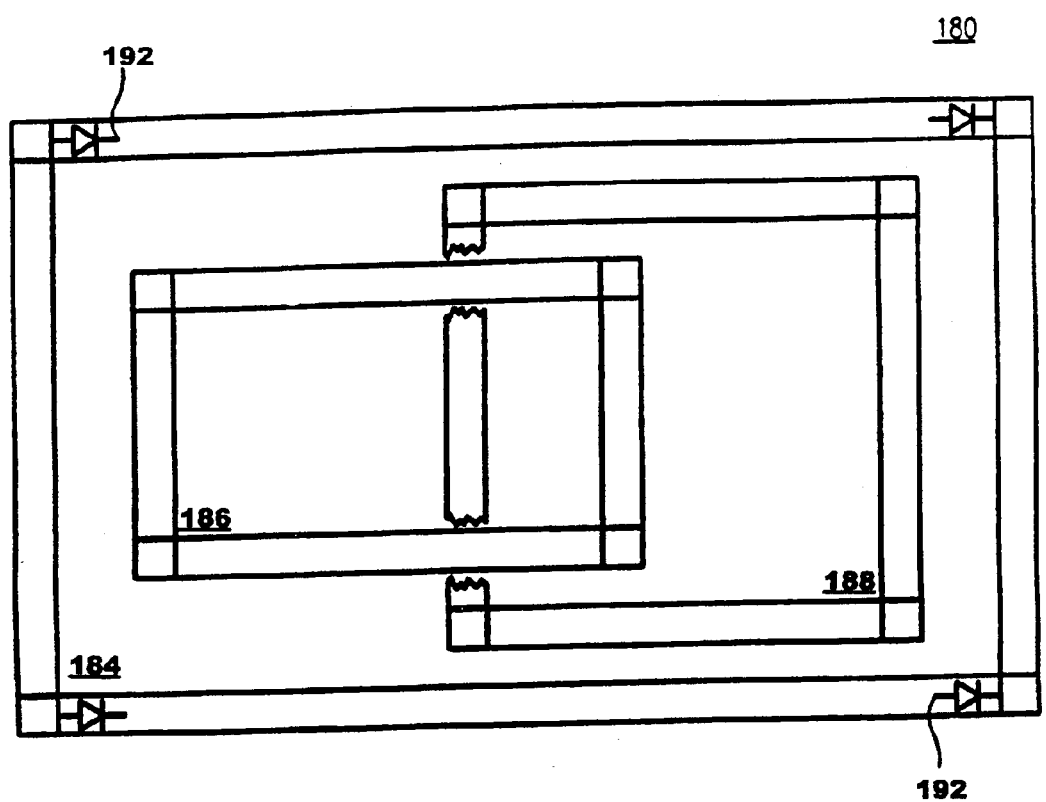
FIG. 7 is a side view of a further preferred embodiment of the multiple quadrature receiver/transmitter coil system according to the present invention.

Referring now to FIG. 7, there is shown magnetic receiver/transmitter coil array system 180. Magnetic receiver/transmitter coil array system 180 is a preferred embodiment of the system of the present invention that includes outer coil element 184 and inner coil elements 186, 188. In the embodiment of FIG. 7, inner coil elements 186, 188 function as both receive elements and transmit elements. Excitation can be applied to inner coil elements 186, 188 by means of inductive coupling from external loops added to the coil. For example, four such loops can be used to excite a quadrature field in each of inner coil elements 186, 188.

As previously described with respect to coil system 60, splitters 104 can be used to provide four outputs of a selectively determined relative amplitude and phase to drive the four loops added to the current coil design with the appropriate power levels and signal phases to provide the most uniform transmit field possible. PIN diode networks 192 can be used to isolate the coil elements from the coil during transmission.

Thus, quadrature receiving coil system 60 and its alternate embodiments provide an improvement over previous receiving coils when multiple means for processing image signals are available. The sensitive volume of the coil system is expanded allowing for the interception of both quadrature components of MR signals in a spatially dependent manner, with each coil providing coverage of a portion of the desired sensitive volume along the axis parallel to the main magnetic field. Consequently, each coil had a sensitive volume smaller than that which would otherwise be necessary and each such coil provided improved signal to noise ratio from the region within its sensitive volume.

The above description is intended by way of example only and is not intended to limit the present invention in any way, except as set forth in the following claims. For example, it is to be understood that the present invention is not limited to two coil systems. Rather, the present invention may be embodied as an N-quadrature coil system, where N is an integer, and where N processing means are available for each coil system. Furthermore, the present invention can include any method and system for adding transmit capability to a quadrature phased array coil element by extending one part of the coil in transmit only, transmitting with both coils with proper amplitude and phase, and using external local transmit coil elements.

What is claimed is:

1. A transmit/receive (T/R) phased array coil system for use with a magnetic resonance imaging (MRI) system having a transmitter and a data acquisition system, the T/R phased array coil system comprising:

(a) a first coil defining a first region;
    (b) a second coil defining a second region, said first and said second coils defining an overlap region in which one of said coils is partially overlapped by the other of said coils to form a phased array coil subsystem;
    (c) a power splitter for allocating between said first and said second coils radio frequency (RF) power received from said transmitter;
    (d) an attenuator for reducing said RF power allocated to at least one of said first and said second coils;
    (e) a phase compensator for affecting a phase relationship between (I) a first magnetic field producible through said first coil over said first region corresponding thereto and (II) a second magnetic field producible through said second coil over said second region corresponding thereto; and
    (f) a plurality of switches for enabling switching between (I) a transmit state wherein said phased array coil subsystem is coupled to said transmitter and decoupled from said data acquisition system so that a substantially uniform magnetic field is formed in: (A) said overlap region by interaction of said first and said second magnetic fields; and (B) at least portions of said first and said second regions outside said overlap region predominantly by said first and said second magnetic fields, respectively; thereby enabling said phased array coil subsystem to apply said substantially uniform magnetic field to an anatomical structure placed within at least one of said first region, said second region and said overlap region; and (II) a receive state wherein said phased array coil subsystem is decoupled from said transmitter and coupled to said data acquisition system thereby enabling a response of said anatomical structure to said substantially uniform magnetic field received by said phased array coil subsystem to be conveyed to said data acquisition subsystem.

2. The T/R phased array coil system of claim 1 further comprising a ninety degree element for at least one of said first and said second coils, said ninety degree element operable to:

(a) split said RF power allocated to said coil corresponding thereto into a pair of coil-exciting signals, and (b) phase-shift one of said coil-exciting signals relative to the other of said coil-exciting signals, with said one of said coil-exciting signals being applied to said coil corresponding thereto at a point ninety degrees apart from the other so that said magnetic field generated therewith, and produced over said region corresponding thereto, is circularly polarized, thereby employing said coil corresponding thereto as a quadrature coil.

3. The T/R phased array coil system of claim 1 further comprising a ninety degree element for at least one of said first and said second coils, said ninety degree element operable to:

(a) split said RF power allocated to said coil corresponding thereto into a pair of coil-exciting signals; and (b) phase-shift one of said coil-exciting signals relative to the other of said coil-exciting signals.

4. The T/R phased array coil system of claim 1 wherein at least one of said first and said second coils is a quadrature coil.

5. The T/R phased array coil system of claim 1 wherein said first and said second coils each detect said response as a magnetic resonance signal of a portion of said anatomical structure covered thereby, with said magnetic resonance signals of each of said coils being conveyed to a separate processing port of said data acquisition system.

6. The T/R phased array coil system of claim 1 wherein at least one of said first and said second coils detects said response as quadrature components of a magnetic resonance signal of a portion of said anatomical structure covered thereby, with said quadrature components of each of said coils being conveyed to a separate processing port of said data acquisition system.

7. The T/R phased array coil system of claim 1 wherein:

(a) in said transmit state, said plurality of switches (A) couple said phased array coil subsystem to a transmit port of said transmitter and (B) decouple said phased array coil subsystem from processing ports of said data acquisition system; and (b) in said receive state, said plurality of switches (A) decouple said phased array coil subsystem from said transmit port of said transmitter and (B) couple said phased array coil subsystem to said processing ports of said data acquisition system.

8. The T/R phased array coil system of claim 1 wherein said plurality of switches are PIN diodes.

9. The T/R phased array coil system of claim 1 wherein at least one of said first and said second coils is a volume coil.

10. A transmit/receive (T/R) phased array coil system for use with a magnetic resonance imaging (MRI) system having a transmitter and a data acquisition system, the T/R phased array coil system comprising:

(a) a first volume coil defining a first region;

(b) a second volume coil defining a second region, said first and said second volume coils defining an overlap region in which one of said volume coils is partially disposed within the other of said volume coils to form a phased array coil subsystem; and (c) an interface subsystem operably coupled to said phased array coil subsystem, said interface subsystem comprising:

(I) a power splitter for allocating between said first and said second volume coils radio frequency (RF) power received from said transmitter;

(II) a phase compensator for affecting a phase relationship between (A) a first magnetic field producible through said first volume coil over said first region corresponding thereto and (B) a second magnetic field producible through said second volume coil over said second region corresponding thereto; and (III) a plurality of switches for enabling said interface subsystem to be switched between (A) a transmit state wherein said phased array coil subsystem is coupled to said transmitter and decoupled from said data acquisition system so that a substantially uniform magnetic field is formed over (1) said overlap region by interaction of said first and said second magnetic fields and (2) at least portions of said first and said second regions outside said overlap region predominantly by said first and said second magnetic fields, respectively, thereby enabling said phased array coil subsystem to apply said substantially uniform magnetic field to an anatomical structure placed within at least one of said first, said second and said overlap regions; and (B) a receive state wherein said phased array coil subsystem is decoupled from said transmitter and coupled to said data acquisition system thereby enabling a response of said anatomical structure to said substantially uniform magnetic field to be conveyed through said phased array coil subsystem to said data acquisition subsystem.

11. The T/R phased array coil system of claim 10 wherein said interface subsystem further includes an attenuator for reducing said RF power allocated to at least one of said first and said second volume coils.

12. The T/R phased array coil system of claim 10 wherein said interface subsystem further comprises a ninety degree element for at least one of said first and said second volume coils, said ninety degree element operable to:

(a) split said RF power allocated to said volume coil corresponding thereto into a pair of coil-exciting signals, and (b) phase-shift one of said coil-exciting signals relative to the other of said coil-exciting signals, with said one of said coil-exciting signals being applied to said volume coil corresponding thereto at a point ninety degrees apart from the other so that said magnetic field generated therewith, and produced over said region corresponding thereto, is circularly polarized, thereby employing said volume coil corresponding thereto as a quadrature coil.

13. The T/R phased array coil system of claim 10 wherein said interface subsystem further comprises a ninety degree element for at least one of said first and said second volume coils, said ninety degree element operable to:
 (a) split said RF power allocated to said volume coil corresponding thereto into a pair of coil-exciting signals; and
 (b) phase-shift one of said coil-exciting signals relative to the other of said coil-exciting signals.

14. The T/R phased array coil system of claim 10 wherein at least one of said first and said second volume coils is a quadrature coil.

15. The T/R phased array coil system of claim 10 wherein said first and said second volume coils each detect said response as a magnetic resonance signal of a portion of said anatomical structure covered thereby, with said magnetic resonance signals of each of said volume coils being conveyed to a separate image processing port of said data acquisition system.

16. The T/R phased array coil system of claim 10 wherein at least one of said first and said second volume coils detects said response as quadrature components of a magnetic resonance signal of a portion of said anatomical structure covered thereby, with said quadrature components of each of said volume coils being conveyed to a separate image processing port of said data acquisition system.

17. The T/R phased array coil system of claim 10 wherein:
 (a) in said transmit state, said plurality of switches (A) couple said phased array coil subsystem to a transmit port of said transmitter and (B) decouple said phased array coil subsystem from image processing ports of said data acquisition system; and
 (b) in said receive state, said plurality of switches (A) decouple said phased array coil subsystem from said transmit port of said transmitter and (B) couple said phased array coil subsystem to said image processing ports of said data acquisition system.

18. The T/R phased array coil system of claim 10 wherein said plurality of switches are PIN diodes.

19. A transmit/receive (T/R) phased array coil system for use with a magnetic resonance imaging (MRI) system, the T/R phased array coil system comprising:
 (a) a first coil covering a first region;
 (b) a second coil covering a second region, said first and said second coils defining an overlap region in which one of said coils is partially overlapped by the other of said coils to form a phased array coil subsystem; and
 (c) an interface subsystem connected to said phased array coil subsystem, said interface subsystem comprising a power splitter, an attenuator, a phase compensator, and a plurality of switches for enabling said interface subsystem to be switched between:
  (I) a transmit state wherein (A) said power splitter allocates radio frequency (RF) power received from said MRI system between said first and said second coils with said attenuator reducing said RF power directed to at least one of said first and said second coils so that (i) a first magnetic field is applied through said first coil to said first region corresponding thereto and (ii) a second magnetic field is applied through said second coil to said second region corresponding thereto and (B) said phase compensator affects a phase relationship between said first and said second magnetic fields so as to cause a resultant magnetic field of substantial uniformity to be formed not only in (i) at least portions of said first and said second regions outside said overlap region predominantly by said first and said second magnetic fields, respectively, but also in (ii) said overlap region by interaction of said first and said second magnetic fields, thereby enabling said phased array coil subsystem to apply said resultant magnetic field to an anatomical structure placed within at least one of said first region, said second region and said overlap region; and
  (II) a receive state wherein said interface subsystem receives from said phased array coil subsystem a response of said anatomical structure to said resultant magnetic field and conveys said response to said MRI system.

20. The T/R phased array coil system of claim 19 wherein at least one of said first and said second coils is a volume coil.

21. The T/R phased array coil system of claim 19 wherein said interface subsystem further comprises a ninety degree element for at least one of said first and said second coils, said ninety degree element operable to:
 (a) split said RF power allocated to said coil corresponding thereto into a pair of coil-exciting signals, and
 (b) phase-shift one of said coil-exciting signals relative to the other of said coil-exciting signals, with said one of said coil-exciting signals being applied to said coil corresponding thereto at a point ninety degrees apart from the other so that said magnetic field generated therewith, and produced over said region corresponding thereto, is circularly polarized, thereby employing said coil corresponding thereto as a quadrature coil.

22. The T/R phased array coil system of claim 19 wherein said interface subsystem further comprises a ninety degree element for at least one of said first and said second coils, said ninety degree element operable to:
 (a) split said RF power allocated to said coil corresponding thereto into a pair of coil-exciting signals; and
 (b) phase-shift one of said coil-exciting signals relative to the other of said coil-exciting signals.

23. The T/R phased array coil system of claim 19 wherein at least one of said first and said second coils is a quadrature coil.

24. The T/R phased array coil system of claim 19 wherein said first and said second coils each detect said response as a magnetic resonance signal of a portion of said anatomical structure covered thereby, with said magnetic resonance signals of each of said coils being conveyed to a separate processing port of a data acquisition system of said MRI system.

25. The T/R phased array coil system of claim 19 wherein at least one of said first and said second coils detects said response as quadrature components of a magnetic resonance signal of a portion of said anatomical structure covered thereby, with said quadrature components of each of said coils being conveyed to a separate processing port of a data acquisition system of said MRI system.

26. The T/R phased array coil system of claim 19 wherein:
 (a) in said transmit state, said plurality of switches (A) couple said phased array coil subsystem to a transmit port of said MRI system and (B) decouple said phased array coil subsystem from processing ports of a data acquisition system of said MRI system; and
 (b) in said receive state, said plurality of switches (A) decouple said phased array coil subsystem from said transmit port of said MRI system and (B) couple said phased array coil subsystem to said processing ports of said data acquisition system.

27. The T/R phased array coil system of claim 19 wherein said plurality of switches are PIN diodes.

28. A transmit/receive (T/R) phased array coil system for use with a magnetic resonance imaging (MRI) system, the T/R phased array coil system comprising:
   (a) a first coil covering a first region;
   (b) a second coil covering a second region, said first and said second coils defining an overlap region in which one of said coils is partially overlapped by the other of said coils to form a phased array coil subsystem; and
   (c) an interface subsystem connected to said phased array coil subsystem, said interface subsystem comprising a power splitter, an attenuator, a phase compensator, and a plurality of switches for enabling said interface subsystem to be switched between:
      (I) a transmit state wherein said power splitter allocates radio frequency (RF) power received from said MRI system between said first and said second coils with said attenuator reducing said RF power directed to at least one of said first and said second coils so that (A) a first magnetic field is applied through said first coil to said first region corresponding thereto and (B) a second magnetic field is applied through said second coil to said second region corresponding thereto with said phase compensator affecting a phase relationship between said first and said second magnetic fields so as to cause a resultant magnetic field to be substantially uniform not only over at least portions of said first and said second regions outside said overlap region but also over said overlap region by interaction of said first and said second magnetic fields, thereby enabling said phased array coil subsystem to apply said resultant magnetic field to an anatomical structure placed within at least one of said first region, said second region and said overlap region; and
      (II) a receive state wherein said interface subsystem receives from said phased array coil subsystem a response of said anatomical structure to said resultant magnetic field and conveys said response to said MRI system.

29. The T/R phased array coil system of claim 28 wherein at least one of said first and said second coils is a volume coil.

30. The T/R phased array coil system of claim 28 wherein said attenuator is connected between said splitter and a smaller of said first and said second coils.

31. The T/R phased array coil system of claim 30 wherein said phase compensator is connected between said splitter and a larger of said first and said second coils, and said interface subsystem further comprises a second ninety degree element connected between said phase compensator and said larger of said first and said second coils.

32. The T/R phased array coil system of claim 30 wherein said interface subsystem further comprises a first ninety degree element connected between said attenuator and said smaller of said first and said second coils.

33. The T/R phased array coil system of claim 28 wherein at least one of said first and said second coils is a quadrature coil.

34. The T/R phased array coil system of claim 28 wherein said first and said second coils each detect said response as a magnetic resonance signal of a portion of said anatomical structure covered thereby, with said magnetic resonance signals of each of said coils being conveyed to a separate image processing port of a data acquisition system of said MRI system.

35. The T/R phased array coil system of claim 28 wherein at least one of said first and said second coils detects said response as quadrature components of a magnetic resonance signal of a portion of said anatomical structure covered thereby, with said quadrature components of each of said coils being conveyed to a separate image processing port of a data acquisition system of said MRI system.

36. The T/R phased array coil system of claim 28 wherein:
   (a) in said transmit state, said plurality of switches (A) couple said phased array coil subsystem to a transmit port of said MRI system and (B) decouple said phased array coil subsystem from image processing ports of a data acquisition system of said MRI system; and
   (b) in said receive state, said plurality of switches (A) decouple said phased array coil subsystem from said transmit port of said MRI system and (B) couple said phased array coil subsystem to said image processing ports of said data acquisition system.

37. The T/R phased array coil system of claim 28 wherein said plurality of switches are PIN diodes.

38. A transmit/receive (T/R) phased array coil system for use with a magnetic resonance imaging (MRI) system, the T/R phased array coil system comprising:
   (a) a first birdcage coil encompassing a first region;
   (b) a second birdcage coil encompassing a second region, said first and said second birdcage coils defining an overlap region in which one of said birdcage coils is partially overlapped by the other of said birdcage coils to form a phased array coil subsystem; and
   (c) an interface subsystem connected to said phased array coil subsystem, said interface subsystem comprising a power splitter, an attenuator, a phase compensator, and a plurality of switches for enabling said interface subsystem to be switched between:
      (I) a transmit state wherein said power splitter allocates radio frequency (RF) power received from said MRI system between said first and said second birdcage coils with said attenuator reducing said RF power directed to at least one of said first and said second birdcage coils so that (A) a first magnetic field is applied through said first birdcage coil to said first region encompassed thereby and (B) a second magnetic field is applied through said second birdcage coil to said second region encompassed thereby with said phase compensator affecting a phase relationship between said first and said second magnetic fields so as to cause a resultant magnetic field to be substantially uniform not only over at least portions of said first and said second regions outside said overlap region but also over said overlap region by interaction of said first and said second magnetic fields, thereby enabling said phased array coil subsystem to apply said resultant magnetic field to an anatomical structure placed within at least one of said first region, said second region and said overlap region; and
      (II) a receive state wherein said interface subsystem receives from said phased array coil subsystem a response of said anatomical structure to said resultant magnetic field and conveys said response to said MRI system.

39. The T/R phased array coil system of claim 38 wherein said attenuator is connected between said splitter and a smaller of said first and said second birdcage coils.

40. The T/R phased array coil system of claim 39 wherein said interface subsystem further comprises a first ninety degree element connected between said attenuator and said smaller of said first and said second birdcage coils.

41. The T/R phased array coil system of claim 39 wherein said phase compensator is connected between said splitter and a larger of said first and said second birdcage coils, and said interface subsystem further comprises a second ninety degree element connected between said phase compensator and said larger of said first and said second birdcage coils.

42. The T/R phased array coil system of claim 38 wherein at least one of said first and said second birdcage coils is a quadrature coil.

43. The T/R phased array coil system of claim 38 wherein said first and said second birdcage coils each detect said response as a magnetic resonance signal of a portion of said anatomical structure covered thereby, with said magnetic resonance signals of each of said birdcage coils being conveyed to a separate image processing port of a data acquisition system of said MRI system.

44. The T/R phased array coil system of claim 38 wherein at least one of said first and said second birdcage coils detects said response as quadrature components of a magnetic resonance signal of a portion of said anatomical structure covered thereby, with said quadrature components of each of said birdcage coils being conveyed to a separate image processing port of a data acquisition system of said MRI system.

45. The T/R phased array coil system of claim 38 wherein:
   (a) in said transmit state, said plurality of switches (A) couple said phased array coil subsystem to a transmit port of said MRI system and (B) decouple said phased array coil subsystem from image processing ports of a data acquisition system of said MRI system; and
   (b) in said receive state, said plurality of switches (A) decouple said phased array coil subsystem from said transmit port of said MRI system and (B) couple said phased array coil subsystem to said image processing ports of said data acquisition system.

46. The T/R phased array coil system of claim 38 wherein said plurality of switches are PIN diodes.

47. A transmit/receive (T/R) phased array coil system for use with a magnetic resonance (MR) system, the T/R phased array coil system comprising:
   (a) a first coil covering a first region;
   (b) a second coil covering a second region, said first and said second coils defining an overlap region in which one of said coils is partially overlapped by the other of said coils to form a phased array coil subsystem; and
   (c) an interface subsystem operably connected to said phased array coil subsystem, said interface subsystem capable of being switched between (I) a transmit state wherein a resultant magnetic field of substantial uniformity is generated not only over said first and said second regions, but also over said overlap region by interaction of first and second magnetic fields set up through said first and said second coils, respectively; and (II) a receive state wherein said interface subsystem receives a response of an anatomical structure placed within said phased array coil subsystem to said resultant RF magnetic field and conveys said response to said MR system.

48. A phased array coil system for use with a magnetic resonance system, the phased array coil system comprising:
   (a) a first coil defining a first region;
   (b) a second coil defining a second region, the first coil partially overlapping the second coil to define an overlap region formed by the intersection of the first and second regions; and
   (c) an interface subsystem operably connected with the first and second coils, the interface subsystem comprising (i) a power splitter for splitting radio frequency (RF) power for delivery to the first and second coils and (ii) a phase compensator for adjusting the phase relationship of the RF power delivered to the first and second coils so that a magnetic field produced thereby in the overlap region is approximately equal to that produced near the center of each of the first and second regions.

49. The phased array coil system of claim 48 wherein each of the first and second coils is a birdcage coil.

50. The phased array coil system of claim 49 wherein the interface subsystem further includes an attenuator for reducing the RF power allocated to a smaller of the first and second birdcage coils.

51. The phased array coil system of claim 50 wherein at least one of the first and second birdcage coils is a quadrature coil.

52. A phased array coil system for use with a magnetic resonance system, the phased array coil system comprising:
   (a) a first coil defining a first region;
   (b) a second coil defining a second region, the first coil partially overlapping the second coil to define an overlap region formed by the intersection of the first and second regions; and
   (c) an interface subsystem operably connected with the first and second coils, the interface subsystem comprising (i) a power splitter for splitting radio frequency (RF) power for delivery to the first and second coils and (ii) a phase compensator for adjusting the phase relationship of the RF power delivered to the first and second coils to cause partial destructive/constructive interference thereof in the overlap region so that a magnetic field produced thereby in the overlap region is approximately equal to that produced near the center of each of the first and second regions.

53. The phased array coil system of claim 52 wherein each of the first and second coils is a volume coil.

54. The phased array coil system of claim 52 wherein each of the first and second coils is a birdcage coil.

55. The phased array coil system of claim 54 wherein the power splitter splits the RF power for delivery to the first and second birdcage coils to produce first and second magnetic fields in the first and second regions, respectively.

56. The phased array coil system of claim 55 wherein the phase compensator adjusts the phase relationship between the first and second magnetic fields to cause partial destructive/constructive interference thereof in the overlap region so that the magnitude of the resulting magnetic field produced thereby in the overlap region is approximately equal to the magnitude of the first and second magnetic fields near the center of each of the first and second regions, respectively.

57. The phased array coil system of claim 56 wherein the interface subsystem further includes an attenuator for reducing the RF power allocated to a smaller of the first and second birdcage coils.

58. A transmit/receive (T/R) phased array coil system for use with a magnetic resonance imaging (MRI) system, the T/R phased array coil system comprising:
   (a) a first birdcage coil encompassing a first region;
   (b) a second birdcage coil encompassing a second region, the first and second birdcage coils defining an overlap region in which one of the birdcage coils is partially overlapped by the other of the birdcage coils to form a phased array coil subsystem; and (c) an interface subsystem connected to the phased array coil subsystem, the interface subsystem comprising a power splitter, an attenuator, a phase compensator, and a plurality of switches for enabling the interface subsystem to be switched between:
  (I) a transmit state wherein the power splitter allocates radio frequency (RF) power received from the MRI system between the first and second birdcage coils with the attenuator reducing the RF power directed to at least one of the first and second birdcage coils so that (A) a first magnetic field is applied through the first birdcage coil to the first region encompassed thereby and (B) a second magnetic field is applied through the second birdcage coil to the second region encompassed thereby with the phase compensator affecting a phase relationship between the first and second magnetic fields so that a resulting magnetic field produced thereby in the overlap region is approximately equal to the first and second magnetic fields produced near the center of the first and second regions, respectively; and
  (II) a receive state wherein the interface subsystem receives from the phased array coil subsystem a response of an anatomical structure placed therein and conveys the response to the MRI system.

59. The T/R phased array coil system of claim 58 wherein the phase compensator adjusts the phase relationship between the first and second magnetic fields to cause partial destructive/constructive interference thereof in the overlap region so that the magnitude of the resulting magnetic field produced thereby in the overlap region is approximately equal to the magnitude of the first and second magnetic fields near the center of each of the first and second regions, respectively.

60. The T/R phased array coil system of claim 58 wherein at least one of said first and said second birdcage coils is a quadrature coil.

* * * * *